(12) United States Patent
Sakai et al.

(10) Patent No.: US 9,322,846 B2
(45) Date of Patent: Apr. 26, 2016

(54) CONTACTOR

(75) Inventors: Takahiro Sakai, Moriyama (JP); Yoshinobu Hemmi, Otsu (JP)

(73) Assignee: OMRON Corporation, Kyoto (JP)

( * ) Notice: Subject to any disclaimer, the term of this patent is extended or adjusted under 35 U.S.C. 154(b) by 108 days.

(21) Appl. No.: 14/343,114

(22) PCT Filed: Mar. 15, 2012

(86) PCT No.: PCT/JP2012/056654
§ 371 (c)(1),
(2), (4) Date: Mar. 6, 2014

(87) PCT Pub. No.: WO2013/054554
PCT Pub. Date: Apr. 18, 2013

(65) Prior Publication Data
US 2014/0218062 A1  Aug. 7, 2014

(30) Foreign Application Priority Data

Oct. 14, 2011 (JP) .................................. 2011-227170

(51) Int. Cl.
*G01R 1/067* (2006.01)
*H01R 13/24* (2006.01)

(52) U.S. Cl.
CPC ........ *G01R 1/06716* (2013.01); *G01R 1/06722* (2013.01); *H01R 13/2428* (2013.01); *H01R 2201/20* (2013.01)

(58) Field of Classification Search
None
See application file for complete search history.

(56) References Cited

U.S. PATENT DOCUMENTS

2002/0000821 A1\* 1/2002 Haga .................. G01R 1/06716
324/755.05
2006/0238209 A1\* 10/2006 Chen ....................... G01R 3/00
324/755.01

FOREIGN PATENT DOCUMENTS

| JP | S5537787 A | 3/1980 |
|----|------------|--------|
| JP | 10125428 | 5/1998 |
| JP | 2002008760 | 1/2002 |
| JP | 2002134202 A | 5/2002 |
| JP | 2002164135 | 6/2002 |
| JP | 2003307525 A | 10/2003 |
| JP | 2004138391 | 5/2004 |
| JP | 3120893 U | 4/2006 |
| JP | 3122168 U | 6/2006 |
| JP | 2008047417 | 2/2008 |
| JP | 2009128218 | 6/2009 |
| JP | 2009146817 | 7/2009 |
| JP | 2011502339 | 1/2011 |
| JP | 2011146295 | 7/2011 |

OTHER PUBLICATIONS

International Search Report for corresponding application PCT/JP2012/056658 filed Mar. 15, 2012; Mail date Jun. 5, 2012.

\* cited by examiner

*Primary Examiner* — Paresh Patel
(74) *Attorney, Agent, or Firm* — Shinjyu Global IP

(57) ABSTRACT

A contactor including a bellows body, a fixed portion connected to one end of the bellows body, a movable portion connected to the other end of the bellows body, and a movable touch piece that extending from at least one side edge along the bellows body, where the movable portion is configured to be depressed to compress the bellows body and to bring a movable contact point, located at a free end of the movable touch piece, into contact with the fixed portion.

19 Claims, 6 Drawing Sheets

CONTACTOR

CROSS REFERENCE TO RELATED APPLICATION

This application is the United States National Phase of International Patent Application Number PCT/JP2012/056654 filed on 15 Mar. 2012 which claims priority to Japanese Patent Application No. 2011-227170 filed on 14 Oct. 2011, all of which said applications are herein incorporated by reference in their entirety.

TECHNICAL FIELD

The present invention relates to a contactor, and for example, relates to a contactor used for an integrated circuit inspection probe.

BACKGROUND ART

In the past, a contactor used for an integrated circuit inspection probe has traditionally been a contactor of an electronic terminal receptacle, which holds contact between an electrode terminal of an electronic component and an electrode portion of a receptacle body by depressing the electronic component to the receptacle body, and which connects the electrode portion of the receptacle body to an electrode terminal of a connected electronic component. The electrode portion of the receptacle main body is formed by performing punching on an elastic plate material with a predetermined thickness, and has at both ends a pair of contacts respectively connected with the electrode terminal of the electronic component and the electrode terminal of the connected electronic component, while having a meandering portion successively installed in parallel and provided between the pair of contacts to connect the pair of contacts. Such configuration can be see, for example, in Japanese Unexamined Patent Publication No. 2002-134202.

However, in the contactor of the foregoing electronic terminal receptacle, the number of folds of the meandering portion is small and a desired displacement amount is thus difficult to ensure, which leads to lowered usability. For this reason, in order to ensure the desired displacement amount, a long contactor of the electronic terminal receptacle can be used where the number of folds has been increased. However, when the meandering portion of the long contactor becomes narrow, electric resistance increases to make it difficult for a current to flow and there are thus imposing problematic limits on lengthening of the contactor.

BRIEF SUMMARY OF THE INVENTION

In view of the foregoing, the invention provides a contactor having desired conductivity while ensuring a predetermined displacement amount.

More particularly, the invention provides a contactor including a bellows body, a fixed portion connected to one end of the bellows body, a movable portion connected to the other end of the bellows body, and a movable touch piece that extending from at least one side edge along the bellows body, where the movable portion is configured to be depressed to compress the bellows body and to bring a movable contact point, located at a free end of the movable touch piece, into contact with the fixed portion.

DETAILED DESCRIPTION

Embodiments of a contactor according to the present invention will be described in accordance with the accompanying drawing of FIGS. 1 to 4.

Figure 1:
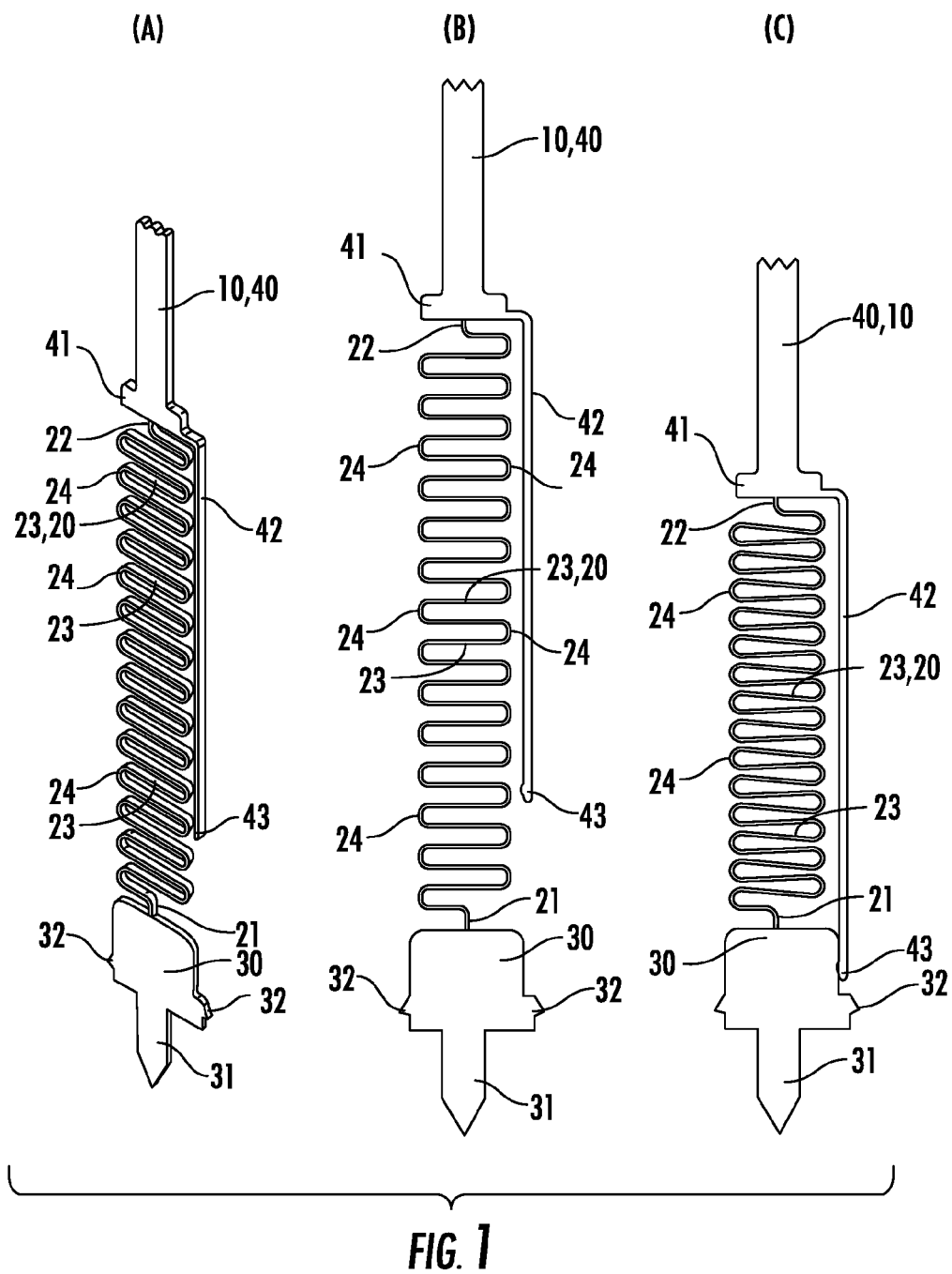
FIG. 1A is a perspective view showing a first embodiment of a contactor according to the present invention.
FIGS. 1B and 1C are front views respectively showing the contactor before and after an operation.
Figure 2:
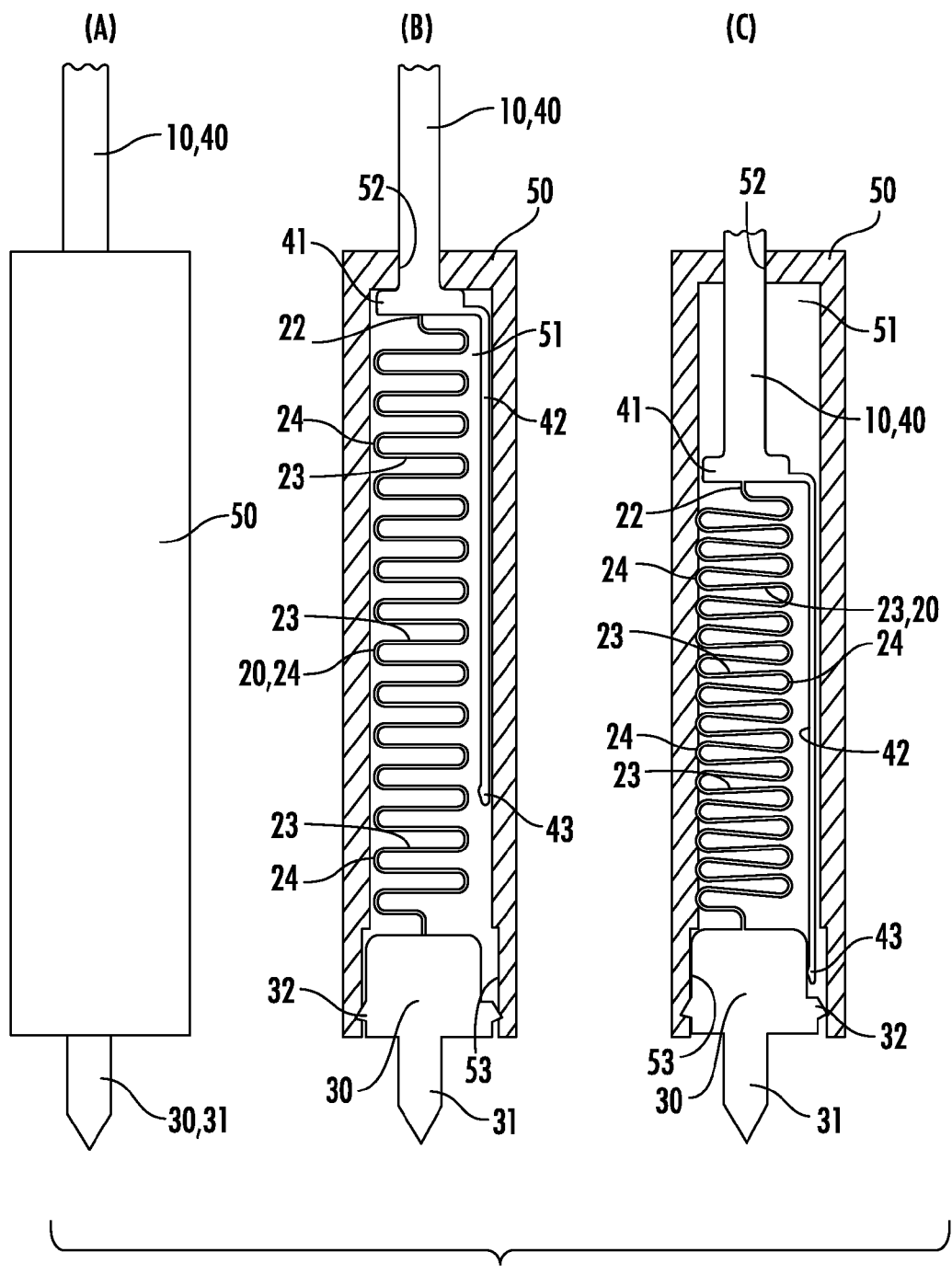
FIG. 2A is a front view of a state where the contactor shown in FIG. 1 has been housed inside a housing.
FIGS. 2B and 2C are front sectional views respectively showing the contactors before and after the operation.

A first embodiment is one in which, as shown in FIGS. 1 and 2, a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23 and arc portions 24 each connecting adjacent intermediate portions 23. The bellows body 20 may have a cross section with an aspect ratio being not smaller than 1.5, preferably not smaller than 2, and may be formed by pressing or by electroforming. It is to be noted that the aspect ratio here refers to a ratio of a thickness and a height on the cross section of the bellows body 20.

The one end 21 of the bellows body 20 is connected onto a shaft center of the fixed portion 30 at an upper end thereof, and a terminal portion 31 is extended at a lower end of the fixed portion 30 along the shaft center. Further, a locking claw portion 32 is projectingly provided on each side surface of the fixed portion 30.

The movable portion 40 has the front surface in a substantially T-shape. The other end 22 of the bellows body 20 is connected onto the shaft center at a lower end of a large width portion 41 of the movable portion 40, while a movable touch piece 42 is extended from the one side edge thereof along the bellows body 20. A free end of the movable touch piece 42 comprises a movable contact point 43.

As shown in FIG. 2, the housing 50 has a rectangular-parallelepiped shape having a slit 51 where the contactor 10 can be housed, and the upper end of the housing 50 has an operation hole 52, while the lower end thereof has a press-fitting hole 53.

Then, as shown in FIG. 2, when the movable portion 40 is pressed down, the large width portion 41 descends by the bellows body 20 being compressed, and the movable contact point 43 of the movable touch piece 42 comes into contact with the side surface of the fixed portion 30, to cause a short circuit. Hence the contact resistance decreases, to allow a current to flow.

Figure 3:
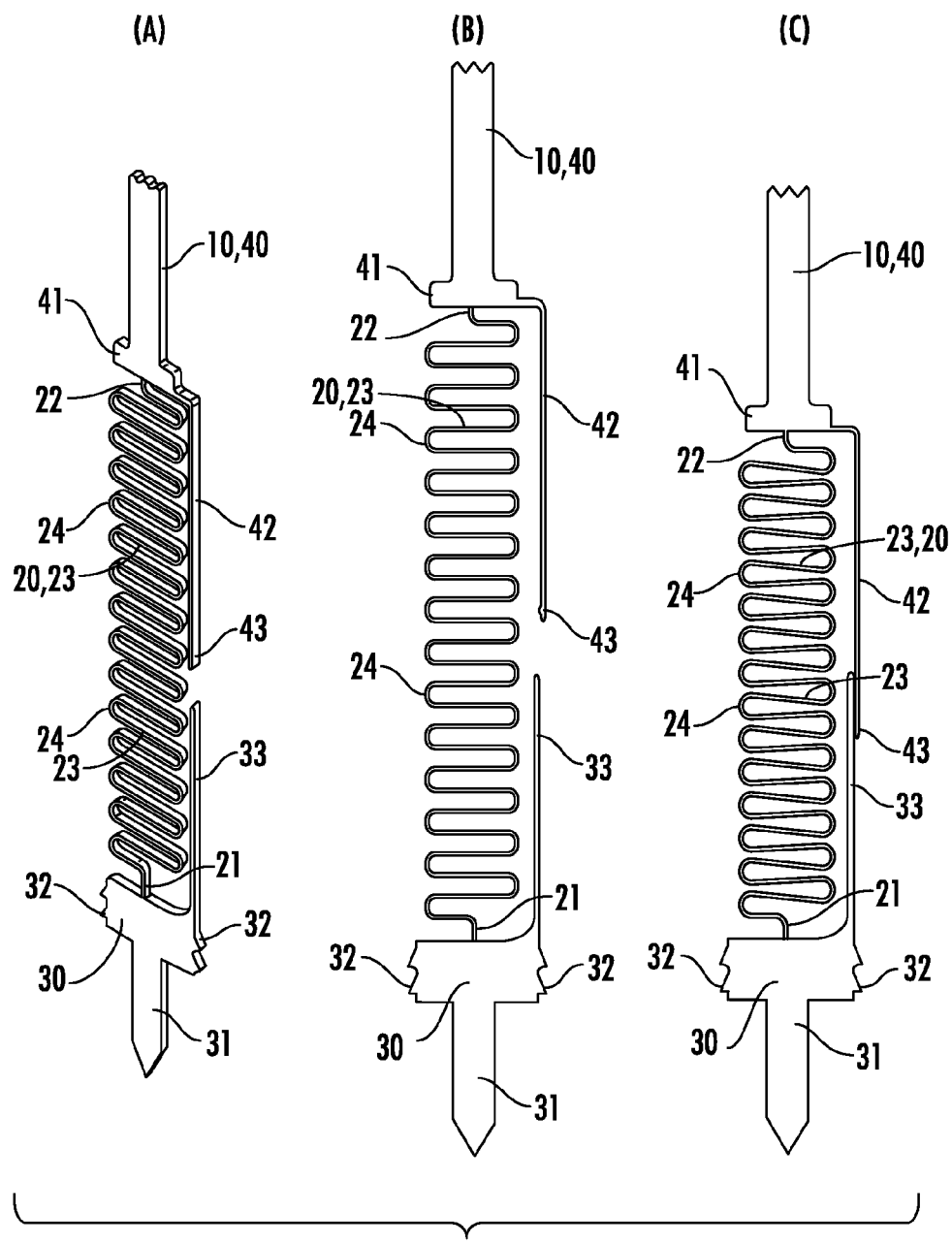
FIG. 3A is a perspective view showing a second embodiment of a contactor according to the present invention.
FIGS. 3B and 3C are front views respectively showing the contactor before and after the operation.
Figure 4:
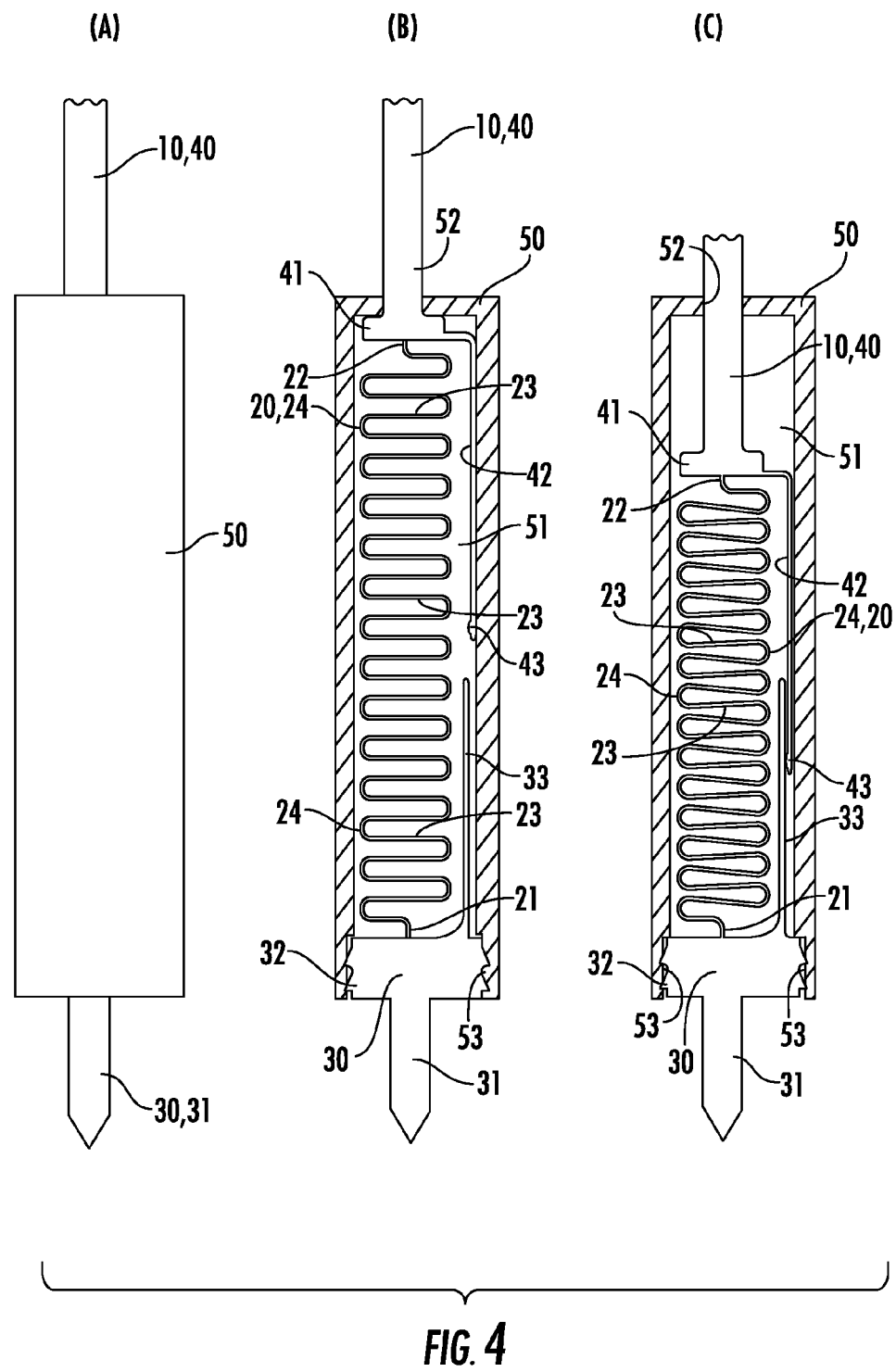
FIG. 4A is a front view of a state where the contactor shown in FIG. 3 has been housed inside a housing.
FIGS. 4B and 4C are front sectional views respectively showing the contactors before and after the operation.

As shown in FIGS. 3 and 4, a second embodiment is similar to the foregoing first embodiment, where a contactor 10 is formed of a bellows body 20, a fixed portion 30 connected to one end 21 of the bellows body 20, and a movable portion 40 connected to the other end 22 of the bellows body 20. The contactor 10 is housed inside a housing 50.

The bellows body 20 is formed of linear-shaped intermediate portions 23 and arc portions 24 each connecting adjacent intermediate portions 23.

The one end 21 of the bellows body 20 is connected onto a shaft center of the fixed portion 30 at the upper end thereof, and a terminal portion 31 is extended at the lower end of the fixed portion 30 along the shaft center. Further, a locking claw portion 32 is projectingly provided on each side surface of the fixed portion 30, and a fixed touch piece 33 is extended from one side edge of the upper side of the fixed portion 30 along the bellows body 20.

The movable portion 40 has the front surface in a substantially T-shape. The other end 22 of the bellows body 20 is connected at the shaft center at the lower end of a large width portion 41 of the movable portion 40, while a movable touch piece 42 is extended from the one-side edge thereof in parallel along the bellows body 20. A free end of the movable touch piece 42 comprises a movable contact point 43.

As shown in FIG. 4, the housing 50 has a rectangular-parallelepiped shape having a slit 51 where the contactor 10 can be housed, and the upper end of the housing 50 has an operation hole 52, while the lower end thereof has a press-fitting hole 53.

When the movable portion 40 is pressed down, the bellows body 20 is compressed, the large width portion 41 descends and the movable contact point 43 of the movable touch piece 42 comes into contact with the outer side surface of the fixed touch piece 33, to cause a short circuit, whereby the contact resistance decreases and a current flows.

According to the present embodiment, there is an advantage of adjusting the timing for contact switching by adjusting the lengths of the movable touch piece 42 and the fixed touch piece 33.

Figure 5:
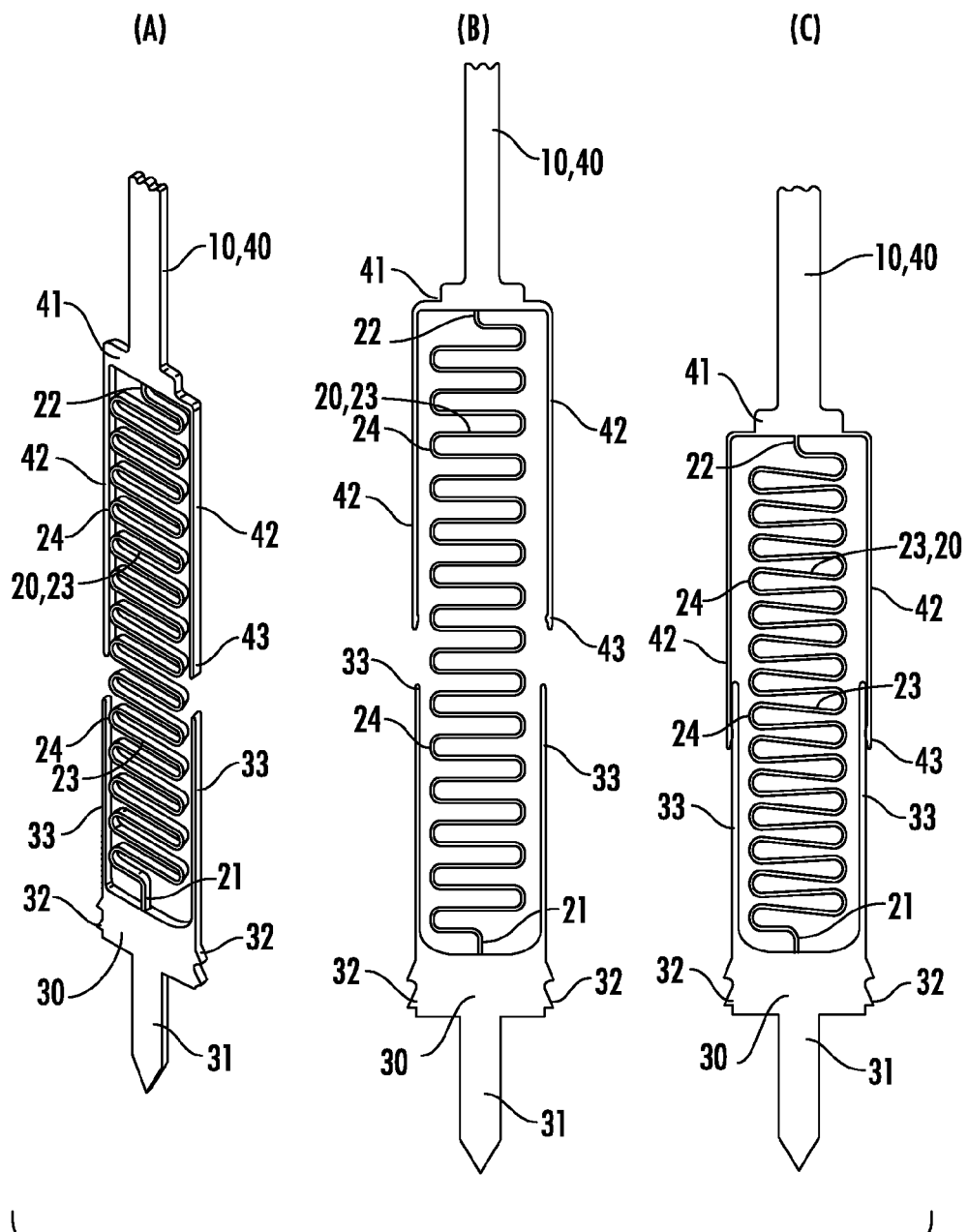
FIG. 5A is a perspective view showing another embodiment of a contactor according to the present invention.
FIGS. 5B and 5C are front views respectively showing the contactor before and after the operation.
Figure 6:
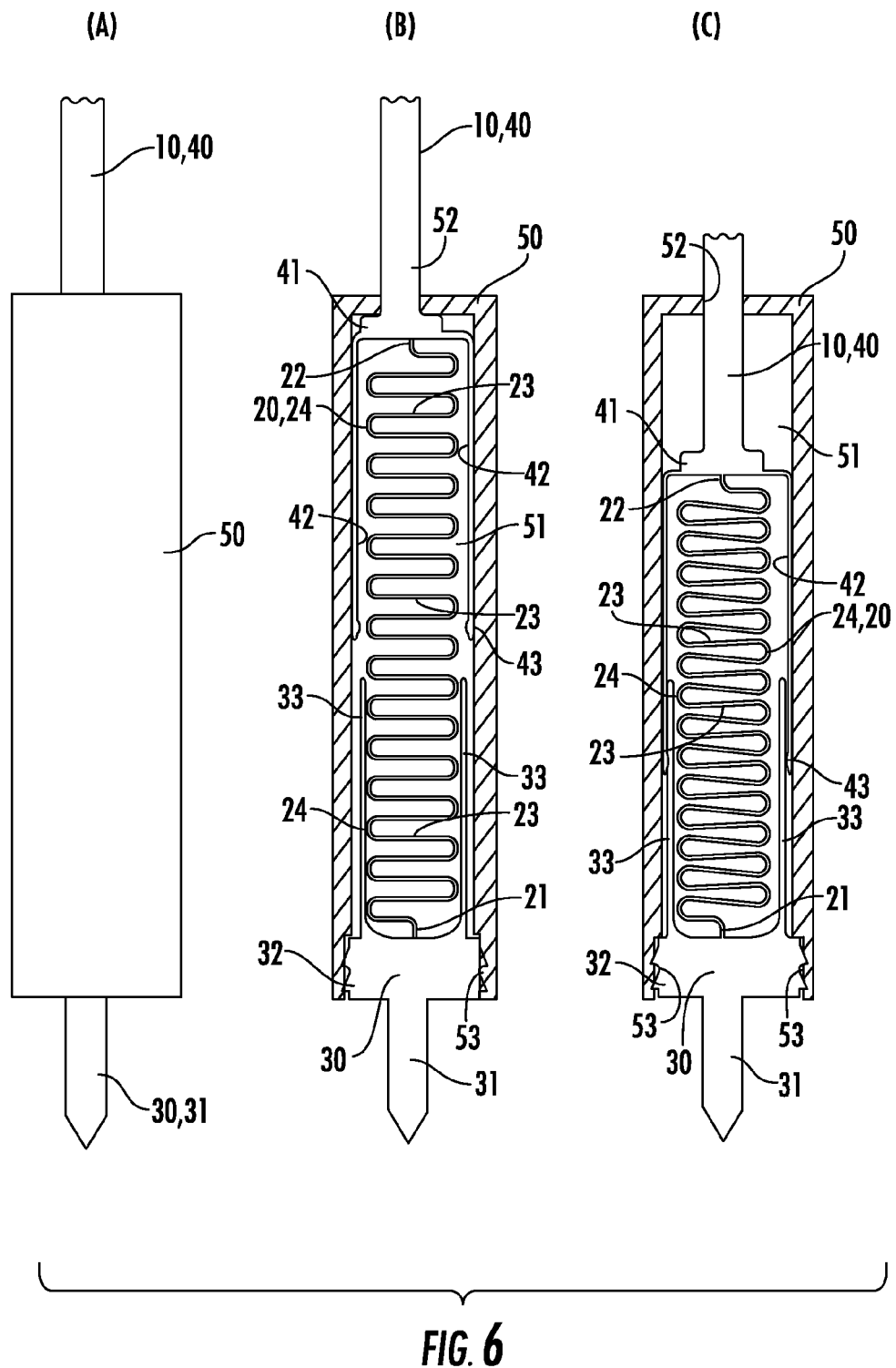
FIG. 6A is a front view of a state where the contactor shown in FIG. 5 has been housed inside a housing.
FIGS. 6B and 6C are front sectional views respectively showing the contactors before and after the operation.

Although the case has been described in the foregoing embodiment where the movable touch piece 42 is provided on one side of the bellows body 20, the movable touch piece 42 may be arranged on each side of the bellows body 20, or the fixed touch piece 33 may be provided on each side accordingly. FIGS. 5(A)-5(C) illustrate an embodiment where the movable touch piece 42 is disposed on each side of the bellows body 20 and the moveable piece 30 correspondingly includes fixed touch pieces 33 disposed on either side of the bellows body 20. FIG. 6(A) shows the contactor of FIGS. 5(A)-5(C) disposed inside a housing 50, and FIGS. 6(B) and 6(C) show the contactor of this embodiment before and after the operation.

Further, although the foregoing embodiments have described that the bellows body 20 is formed of the linear-shaped intermediate portion 23 and the arc portion 24 connecting the adjacent intermediate portions 23, the bellows body 20 may be formed of curve-shaped intermediate portions and arc portions each connecting the adjacent intermediate portions.

The contactor according to the present invention is not only usable as an integrated circuit inspection probe, but also usable as a switch or a contact terminal of a battery. Especially when it is used as the integrated circuit inspection probe, since the above contactor can be formed with a small thickness, it is possible to arrange a large number of contactors at narrow pitches, while obtaining an integrated circuit inspection probe with a small number of components.

Needless to say, the housing is not restricted to an integrally molded one, but may be one dividable into two parts.

In view of the foregoing, the invention provides a contactor having desired conductivity while ensuring a predetermined displacement amount.

According to the present invention, even when the bellows body is made long for the purpose of ensuring a desired displacement amount, a short-circuit occurs by contact between the movable touch piece of the movable portion and the fixed portion or the fixed touch piece thereof, thus making it possible to reduce contact resistance, so as to obtain a contactor with small contact resistance.

The invention further comprises a configuration where the movable contact point of the movable touch piece extends from each side edge of the movable portion and is arranged contactably with and separably from the fixed touch piece extending from each side edge of the fixed portion. Thus, the pair of movable touch pieces is arranged contactably with and separably from the pair of fixed touch pieces, thus making it possible to obtain a contactor with high contact reliability.

As mentioned, the bellows body may have a shape made up of linear-shaped intermediate portions and arc portions each configured to connect the adjacent intermediate portions. Accordingly, it is possible to obtain a contactor easy to design.

Also as described herein, the bellows body may have a shape made up of curve-shaped intermediate portions and arc portions each configured to connect the adjacent intermediate portions. Accordingly, there is an advantage of increasing the design flexibility.

As discussed above, a position of contact between the bellows body and the fixed portion may be arranged on a shaft center of the fixed portion. Accordingly, when the position of contact between the bellows body and the fixed portion is arranged on the shaft center of the fixed portion, there can be obtained a contactor being operable by small force of operation and having a long life.

Also as described herein, a position of contact between the bellows body and the movable portion may be arranged on a shaft center of the movable portion. Accordingly, when the position of contact between the bellows body and the movable portion is arranged on the shaft center of the movable portion, there is an effect of being able to obtain a contactor being operable by small force of operation and having a long life.

Although the invention has been described in detail for the purpose of illustration based on what is currently considered to be the most practical and preferred embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

The invention claimed is:

1. A contactor, comprising:
a bellows body;
a fixed portion connected to one end of the bellows body; and
a movable portion, connected to the other end of the bellows body and comprising a movable touch piece that extends from at least one side edge along the bellows body, a movable contact point located at a free end of the movable touch piece;

the movable contact point being separated from the fixed portion in an uncompressed state;

wherein when the movable portion is depressed it compresses the bellows body and through such displacement, the movable contact point is brought into contact with the fixed portion.

2. The contactor according to claim 1, wherein a fixed touch piece configured to contact with and separate from the movable contact point of the movable touch piece extends from at least one side edge of the fixed portion along the bellows body.

3. The contactor according to claim 2, wherein the movable portion comprises two movable touch pieces:
   a first movable touch piece extending from a first side of the movable portion, the first movable touch piece having a first contact point, and
   a second movable touch piece extending from a second side of the movable portion, the second movable touch piece having a second contact point,
   wherein the fixed portion comprises a first fixed touch piece extending from a first side of the fixed portion and a second fixed touch piece extending from a second side of the fixed portion, the first and second movable contact points being able to contact the first and second fixed touch pieces.

4. The contactor according to claim 1, wherein the bellows body is made up of linear-shaped intermediate portions and arc portions, where the arc portions connect adjacent linear-shaped intermediate portions.

5. The contactor according to claim 1, wherein the bellows body is made up of curve-shaped intermediate portions and arc portions, where the arc portions connect adjacent curve-shaped intermediate portions.

6. The contactor according to claim 1, wherein the bellows body is connected to the fixed portion at a shaft center of the fixed portion.

7. The contactor according to claim 1, wherein the bellows body is connected to the movable portion at a shaft center of the movable portion.

8. The contactor according to claim 2, wherein the bellows body is made up of linear-shaped intermediate portions and arc portions, where the arc portions connect adjacent linear-shaped intermediate portions.

9. The contactor according to claim 3, wherein the bellows body is made up of linear-shaped intermediate portions and arc portions, where the arc portions connect adjacent linear-shaped intermediate portions.

10. The contactor according to claim 2, wherein the bellows body is made up of curve-shaped intermediate portions and arc portions, where the arc portions connect adjacent curve-shaped intermediate portions.

11. The contactor according to claim 3, wherein the bellows body is made up of curve-shaped intermediate portions and arc portions, where the arc portions connect adjacent curve-shaped intermediate portions.

12. The contactor according to claim 2, wherein the bellows body is connected to the fixed portion at a shaft center of the fixed portion.

13. The contactor according to claim 3, wherein the bellows body is connected to the fixed portion at a shaft center of the fixed portion.

14. The contactor according to claim 4, wherein the bellows body is connected to the fixed portion at a shaft center of the fixed portion.

15. The contactor according to claim 5, wherein the bellows body is connected to the fixed portion at a shaft center of the fixed portion.

16. The contactor according to claim 2, wherein the bellows body is connected to the movable portion at a shaft center of the movable portion.

17. The contactor according to claim 3, wherein the bellows body is connected to the movable portion at a shaft center of the movable portion.

18. The contactor according to claim 4, wherein the bellows body is connected to the movable portion at a shaft center of the movable portion.

19. The contactor according to claim 5, wherein the bellows body is connected to the movable portion at a shaft center of the movable portion.

* * * * *